(12) United States Patent  
Koh

(10) Patent No.: US 7,153,743 B2
(45) Date of Patent: Dec. 26, 2006

(54) METHODS OF FABRICATING NON-VOLATILE MEMORY DEVICES

(75) Inventor: Kwan Joo Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/025,504

(22) Filed: Dec. 28, 2004

(65) Prior Publication Data

US 2005/0142762 A1 Jun. 30, 2005

(30) Foreign Application Priority Data

Dec. 30, 2003 (KR) ............... 10-2003-0100717

(51) Int. Cl.
*H01L 21/336* (2006.01)
(52) U.S. Cl. .................. 438/257; 438/261; 438/262
(58) Field of Classification Search ............ 438/257, 438/261, 262
See application file for complete search history.

(56) References Cited

U.S. PATENT DOCUMENTS

| | | | | |
|---|---|---|---|---|
| 6,337,244 B1 * | 1/2002 | Prall et al. | ............... | 438/257 |
| 6,534,818 B1 * | 3/2003 | Hsu | ............... | 257/314 |
| 6,819,592 B1 * | 11/2004 | Noguchi et al. | ...... | 365/185.17 |
| 2003/0100172 A1 * | 5/2003 | Kim et al. | ............... | 438/585 |
| 2004/0104412 A1 * | 6/2004 | Rhodes | ............... | 257/292 |

\* cited by examiner

*Primary Examiner*—Trung Dang
(74) *Attorney, Agent, or Firm*—Andrew D. Fortney

(57) ABSTRACT

Methods of fabricating non-volatile memory devices are disclosed. The resulting non-volatile memory devices include an additional protection film is formed on a control gate pattern to enable the control gate pattern to have a regular and smooth profile regardless of an etching process progressed intensively for removing an active cell isolation film from an active cell isolation trench by using the control gate pattern as a mask, so that the control gate pattern can avoid influence from the impurity even if an impurity injection process is progressed for forming a source diffusion layer, later.

19 Claims, 5 Drawing Sheets

… (US 7,153,743 B2)

METHODS OF FABRICATING NON-VOLATILE MEMORY DEVICES

TECHNICAL FIELD

The present invention relates to semiconductor fabrication and, more particularly, to methods of fabricating non-volatile memory devices.

DISCUSSION OF THE RELATED ART

Following rapid development of technologies related to non-volatile memories, such as, for example, flash memories in which data can be programmed therein or erased therefrom electrically, various geometric structures of non-volatile memory have been micronized gradually. Keeping pace with technology for reducing a size of a source electrode portion of a memory device, the so called Self Aligned Source (SAS) has been developed and widely spread.

In a related art SAS technology, the non-volatile memory device is fabricated by steps as shown in FIG. 1A. After forming a tunnel insulating film 3, a floating gate pattern 4, an Oxide-Nitride-Oxide (ONO) pattern 5, a control gate pattern 6, and so on on an entire surface of a semiconductor substrate 1 having an active cell isolation film 2, an SAS photoresist film pattern 7 is formed on an entire surface of the semiconductor substrate 1. This exposes a portion of a surface of the control gate pattern 6, as shown in FIG. 1B. Subsequently, an active cell isolation film 2 is removed from an active cell isolation trench T by using the control gate pattern 6 exposed by the SAS photoresist film pattern 7 as an etch mask. As shown in FIG. 1C, impurity ions may then be injected to form a source diffusion layer 8 in a bottom portion of the active cell isolation trench T.

In removal of the active cell isolation film 2 from an active cell isolation trench T by using the control gate pattern 6 exposed by the SAS photoresist film pattern 7 as an etch mask, etch impact can not help but be concentrated on exposed portions of the control gate pattern 6. This inevitably results in the formation of intensive damaged portions 6a at the exposed portions of the control gate pattern 6.

In the related art, despite of the intensive damage to the exposed portions of the control gate pattern 6, the source diffusion layer 8 is formed in the bottom of the active cell isolation trench T without taking any measures to prevent the damage, when the impurities for the source diffusion layer 8 can not help but, penetrate deep into an inside of the control gate pattern 6 through the exposed portions of the control gate pattern 6.

Of course, if no measures are taken to prevent the situation in which the impurities have penetrated deep into the control gate pattern 6, the control gate pattern 6 forms an unnecessary electron trap due to the impurities. Thereby failing to perform its regular function, such that a device completed finally also fails in performing regular operation given thereto, such as erasure, programming, and reading.

DETAILED DESCRIPTION

Methods of fabricating non-volatile memory devices are disclosed herein. In particular, methods of fabricating non-volatile memory devices in which an additional protection film is formed on a control gate pattern to enable the control gate pattern to have a regular and smooth profile regardless of an etching process used to removing an active cell isolation film from an active cell isolation trench by using the control gate pattern as a mask. Accordingly, the control gate pattern is protected from an influence of the impurity even if an impurity injection process is used for forming a source diffusion layer at a later point in time.

Figure 1A:
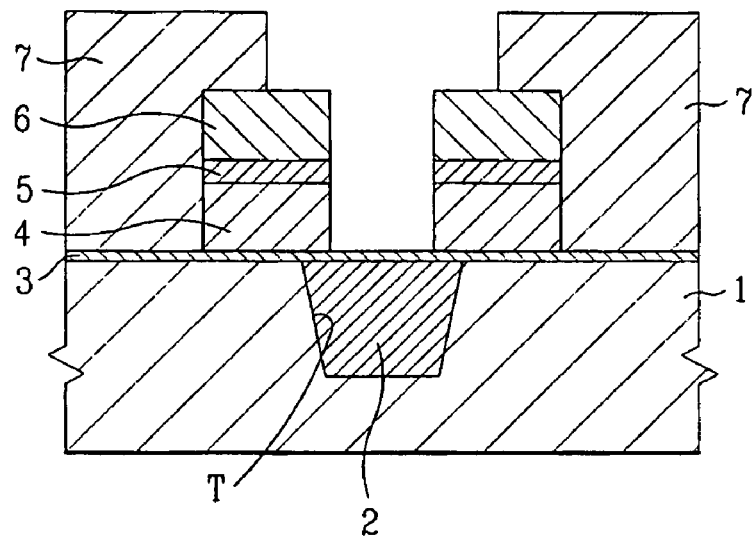
FIGS. 1A to 1C illustrate sections showing a semiconductor device at various stages of processing according to a known method of fabricating a non-volatile memory device.
Figure 1B:
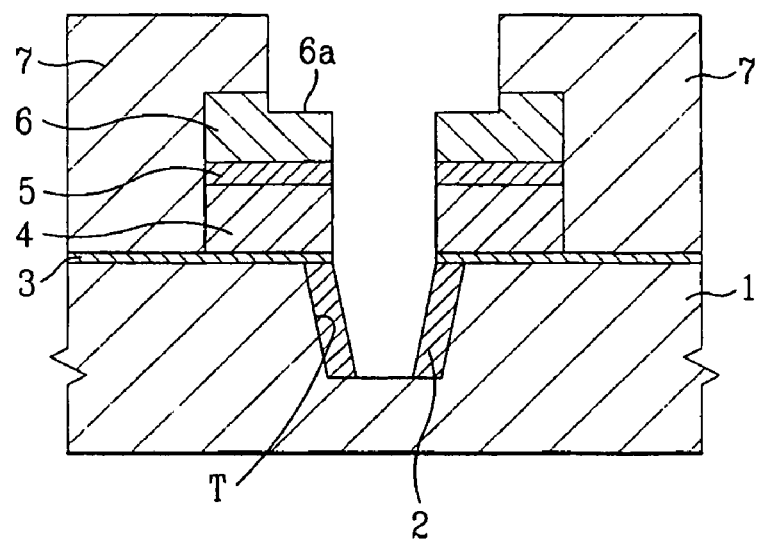
Figure 1C:
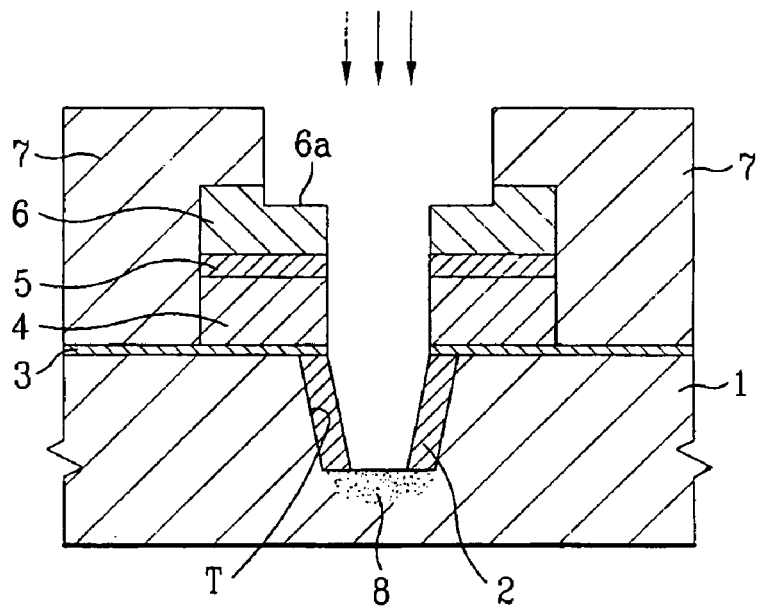
Figure 2A:
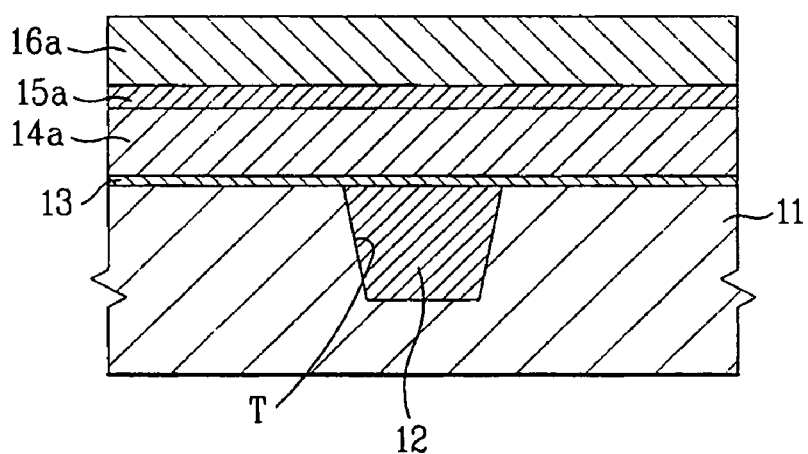
FIGS. 2A to 2G illustrate sections showing a semiconductor device at various stages of processing according to the disclosed methods of fabricating a non-volatile memory device.

Referring to FIG. 2A, an Shallow Trench Isolation Process (STI) is performed selectively, to form a trench T in a semiconductor substrate 11 at a field region. An isolation film 12 is filled in the trench T.

Subsequently, a thermal oxidation process, and chemical vapor deposition process, and so on are performed selectively, to form a tunnel insulating film 13, for an example, a tunnel oxide film, on an entire surface of the semiconductor substrate 11 to a thickness in a range of 100 Å~200 Å. A chemical vapor deposition (CVD) process may be performed, to form a floating gate raw material layer (a first conductive layer) 14a, for an example, a polysilicon layer to a thickness in a range of 1000 Å~1500 Å, on the tunnel insulating film 13. In one example, the floating gate raw material layer 14a is undoped.

Next, a series of chemical vapor deposition processes are performed in succession, to form an ONO raw material layer 15a on the floating gate raw material layer 14a. Additionally, a control gate raw material layer (a second conductive layer) 16a, for an example, a polysilicon layer, may be formed on the ONO raw material layer 15a, to a thickness in a range of 1000 Å~2000 Å. According to one example, the control gate raw material layer 16a remains undoped.

Figure 2B:
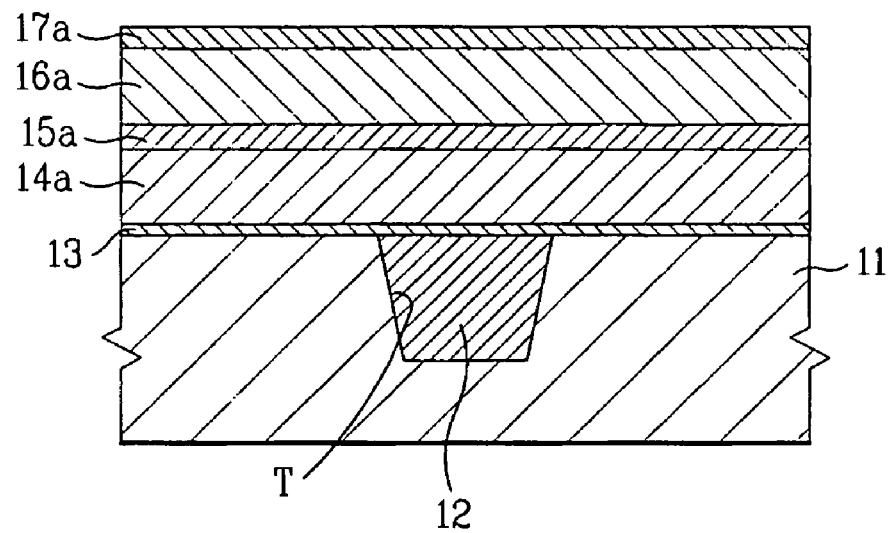
Figure 2C:
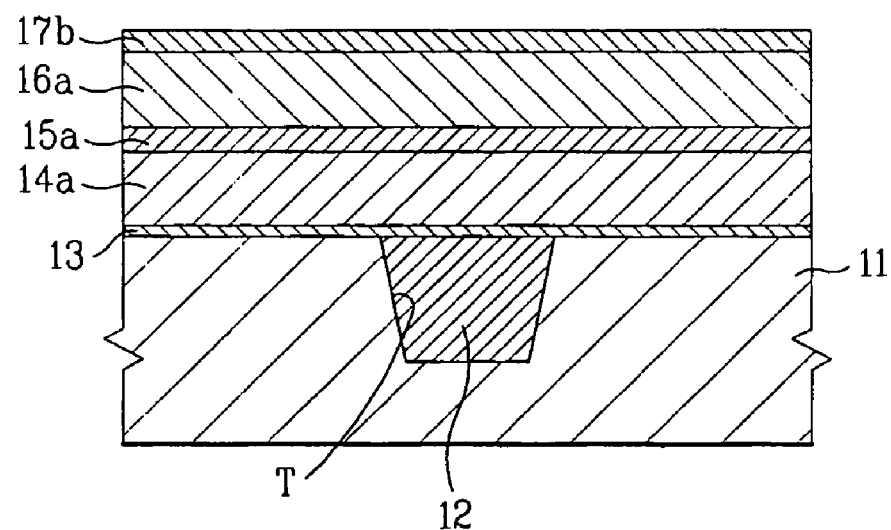

According to one example, referring to FIGS. 2B and 2C, upon completion of the tunnel insulating film 13, the floating gate raw material layer 14a, the ONO raw material layer 15a, the control gate raw material layer 16a, and so on on the semiconductor substrate 11 having the trench T, a silicide forming process is performed, to form a protection film raw material layer 17a on the control gate raw material layer 16a. In one example, the thickness of the protection film raw material layer may be between 150 Å~250 Å.

Then, for example, a sputtering process is performed, to form a metal layer, for an example, a Ti thin film layer, or a Co thin film layer, on the control gate raw material layer 16a.

Next, the semiconductor substrate 11 having the foregoing various structures formed thereon is subjected to a heat treatment process, so that metal atoms in the metal layer 17a, and silicon atoms in the control gate raw material layer 16a make reaction, to convert the metal layer 17a at a surface of the control gate raw material layer 16a into, for an example, a protection film raw material layer 17b of, for an example, $SiTi_x$. This is shown in FIG. 2C. At the end, upon completion of all the above, the control gate raw material layer 16a has the protection film raw material layer 17b thereon, naturally.

Figure 2D:
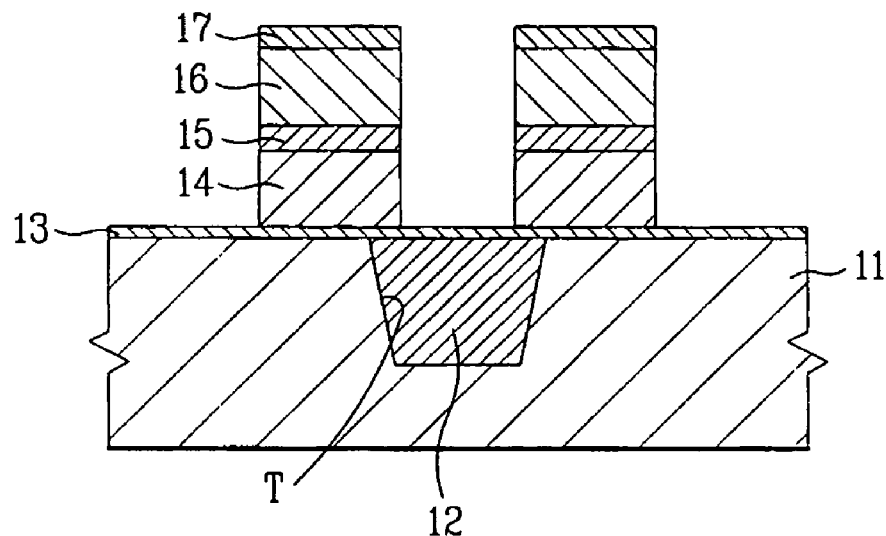

Referring to FIG. 2D, upon completion of formation of the protection film raw material layer 17b on the control gate raw material layer 16a, a photo-etching process is performed, to etch the floating gate raw material layer 14a, the ONO raw material layer 15a, the control gate raw material layer 16a, the protection film raw material layer 17b, and so on at a time. As shown in FIG. 2D, the results of the etchings is a stack including a floating gate pattern 14, an ONO pattern 15, a control gate pattern 16, and a protection film pattern 17. In such an arrangement, a portion of the isolation film 12 is exposed.

Figure 2E:
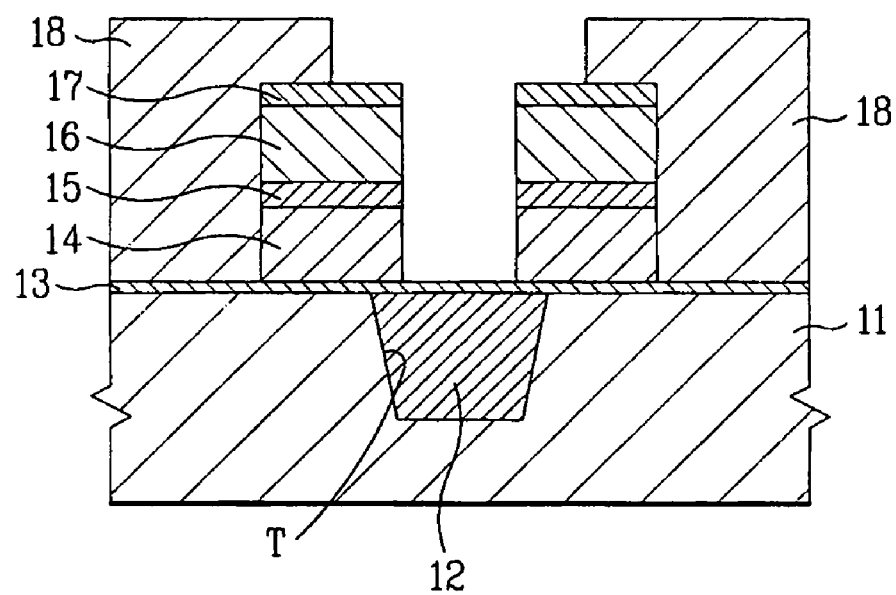

Referring to FIG. 2E, a deposition process is performed to form a photoresist film on the semiconductor substrate 11, and exposure, and development process are performed, to form an SAS photoresist pattern 18 on the semiconductor substrate 11 in a state a portion of the protection film pattern 17 is exposed.

Figure 2F:
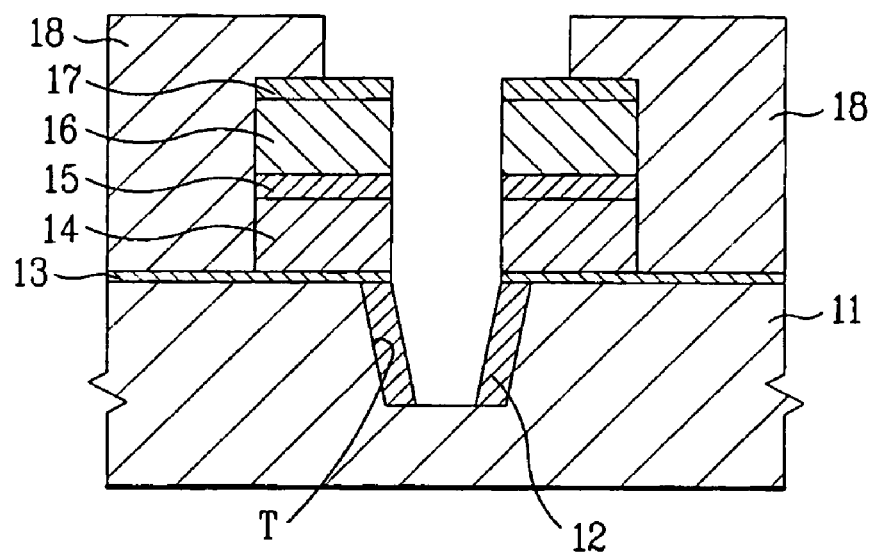
Figure 2G:
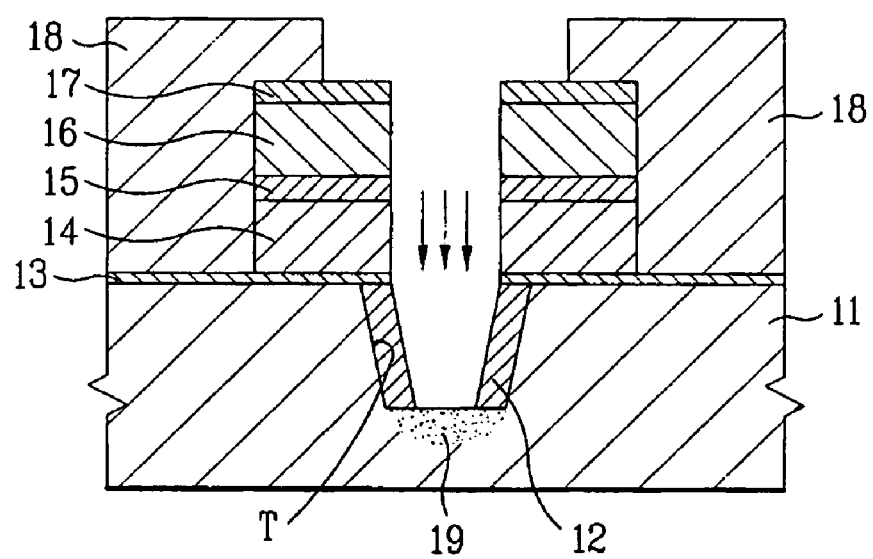

Then, referring to FIG. 2F, an etching process is performed by using the protection film pattern 17 exposed by the SAS photoresist film pattern 18, to remove the isolation film 12 from the trench T.

In this instance, as described before, because the control gate pattern 16 has a protection film pattern 17 formed thereon additionally, even if the etching process is progressed intensively for removing the isolation film 12 from the active cell isolation trench T, the control gate pattern 16 can maintain a regular and smooth profile without any damage.

Then, impurity ion injection process is performed, to form a source diffusion layer 19 in a bottom of the trench T.

In this instance, because the control gate pattern 16 maintains a secure profile owing to a reinforcing action of the protection film pattern 17, even if the impurity injection process is progressed intensively for forming the source diffusion layer 19, the control gate pattern 16 can easily avoid the influence from the impurity.

The control gate pattern 16 avoids not only damage caused at the time of etching the isolation film 12, but also avoids a bad influence due to impurity injection. This is due to the reinforcing action of the projection film pattern 17. A device completed finally can perform regular operations, such as erasure, programming, and reading, given thereto.

As described above, additional protection film on the control gate pattern permits the control gate pattern to have a regular and smooth profile regardless of the etching process, which may be intense, used to remove the active cell isolation film from the active cell isolation trench. This is possible through the use of a control gate pattern as a mask. The control gate pattern can avoid influence from the impurity even if an impurity injection process is progressed for forming a source diffusion layer, later.

Moreover, the avoidance of damage to the control gate pattern 16 from, not only damage caused at the time of etching the active cell isolation film, but also a bad influence due to impurity injection smoothly, to restore a regular function of the control gate pattern owing to an additional reinforcing action of a protection layer formed on the control gate pattern. A device completed finally can perform regular operations, such as erasure, programming, and reading, given thereto.

As disclosed herein, methods of fabricating a non-volatile memory device. The methods result in a non-volatile memory device having a protection film that is formed on a control gate pattern to enable the control gate pattern. Such a structure allows the control gate pattern to have a regular and smooth profile regardless of an etching process used to remove an active cell isolation film from an active cell isolation trench. This is because the control gate pattern is masked to avoid the control gate pattern from being influenced by impurities, even if an impurity injection process is progressed for forming a source diffusion layer.

Additionally, as disclosed herein, a non-volatile memory device includes a control gate pattern that avoids damage caused at the time of etching the active cell isolation film, as well as bad influence due to impurity injection. This is made possible by a protection film that reinforces the control gate pattern, so that a device completed finally can perform regular operations, such as erasure, programming, and reading, given thereto.

An example method of fabricating a non-volatile memory device may include forming a tunnel oxide film, a floating gate raw material layer, an ONO (Oxide-Nitride-Oxide) raw material layer, and a control gate raw material layer on a semiconductor substrate having a trench filled with an active cell isolation film in succession, forming a protection film raw material layer on the control gate raw material layer, etching the floating gate raw material layer, the ONO raw material layer, the control gate raw material layer, and the protection film raw material layer at a time, to form a successive stack of a floating gate pattern, an ONO pattern, a control gate pattern, and a protection film pattern in a state a portion of the active cell isolation film is exposed, forming an SAS (Self Aligned Source) photoresist pattern on the semiconductor substrate to exposed the protection film pattern, removing the active cell isolation film from the trench by using the protection film pattern exposed by the SAS photoresist film pattern, and injecting impurity ions into a bottom of the trench, to for a source diffusion layer.

The present invention claims the benefit of Korean Application No. P2003-0100717 filed on Dec. 30, 2003, which is hereby incorporated by reference as if fully set forth herein.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a non-volatile memory device, comprising:
   preparing a semiconductor substrate having a trench filled with an isolation film;
   forming a tunnel oxide film, a first conductive layer, an Oxide-Nitride-Oxide (ONO) layer, and a second conductive layer on the semiconductor substrate in succession;
   forming a protection layer on the second conductive layer wherein forming the protection layer comprises a silicide process;
   etching the first conductive layer, the ONO layer, the second conductive layer, and the protection layer, to form gate stacks on opposed sides of the isolation film, the gate stacks exposing a portion of the isolation film between the opposed sides, each gate stack comprising a floating gate pattern, an ONO pattern, a control gate pattern, and a protection pattern, and having a first portion over the isolation film in the trench and a second portion over the tunnel oxide film on the substrate;
   forming a photoresist pattern for a self aligned source (SAS) over the semiconductor substrate in such a way that a part of the silicide top surface of the protection pattern and the exposed portion of the isolation film remain uncovered therewith;
   etching the exposed portion of the isolation film using the photoresist pattern and the part of the protection pattern as an etching mask; and
   injecting impurity ions into a bottom of the trench, to form a source diffusion layer.

2. A method as defined by claim 1, wherein the silicide process comprises:

depositing a metal layer on the second conductive layer, and performing a heat treatment process, to make the metal layer react with the second conductive layer, to convert the metal layer into a silicide layer.

3. A method as defined by claim 2, wherein the metal layer comprises a Ti thin film layer or a Co thin film layer.

4. A method as defined by claim 1, wherein the protection layer has a thickness of about 150 Å to about 250 Å.

5. A method as defined by claim 1, wherein the tunnel oxide film has a thickness of about 100 Å to about 200 Å.

6. A method as defined by claim 1, wherein the first conductive layer has a thickness of about 1000 Å to about 1500 Å.

7. A method as defined by claim 1, wherein the second conductive layer has a thickness of about 1000 Å to about 2000 Å.

8. A method as defined by claim 1, wherein the first conductive layer comprises an undoped polysilicon layer.

9. A method as defined by claim 1, wherein forming the first conductive layer comprises a CVD process.

10. A method as defined by claim 1, further comprising forming the trench and isolation film by a STI process.

11. A method as defined by claim 1, wherein forming the tunnel oxide film comprises a thermal oxidation process.

12. A method as defined by claim 1, wherein forming the tunnel oxide film comprises a CVD process.

13. A method as defined by claim 1, wherein forming the ONO layer comprises a series of CVD processes.

14. A method as defined by claim 1, wherein the second conductive layer comprises undoped polysilicon.

15. A method as defined by claim 1, wherein etching the first conductive layer, the ONO layer, the second conductive layer, and the protection layer comprises a photo-etching process.

16. A method as defined by claim 2, wherein depositing the metal layer comprises a sputtering process.

17. A method as defined by claim 1, wherein etching the exposed portion of the isolation film leaves a second portion of the isolation film along sidewalls of the trench.

18. A method as defined by claim 1, wherein the protection pattern reduces art amount of the impurity ions injected into the second conductive layer.

19. A method as defined by claim 1, wherein, after the gate stacks are formed, a cross-section of the device includes the first and second portions of the gate stacks and the bottom of the trench between the gate stacks.

* * * * *